(12) United States Patent
Lin

(10) Patent No.: US 10,720,910 B1
(45) Date of Patent: Jul. 21, 2020

(54) EYE DIAGRAM OBSERVATION DEVICE

(71) Applicant: ASMedia Technology Inc., New Taipei (TW)

(72) Inventor: Yu-Chuan Lin, New Taipei (TW)

(73) Assignee: ASMedia Technology Inc., New Taipei (TW)

(*) Notice: Subject to any disclaimer, the term of this patent is extended or adjusted under 35 U.S.C. 154(b) by 0 days.

(21) Appl. No.: 16/653,917

(22) Filed: Oct. 15, 2019

Related U.S. Application Data

(60) Provisional application No. 62/854,322, filed on May 30, 2019.

(30) Foreign Application Priority Data

Aug. 2, 2019 (TW) .............................. 108127552 A

(51) Int. Cl.
*H03K 5/135* (2006.01)
*H03K 19/20* (2006.01)

(52) U.S. Cl.
CPC ............. *H03K 5/135* (2013.01); *H03K 19/20* (2013.01)

(58) Field of Classification Search
CPC ................................ H03K 5/135; H03K 19/20
USPC ........................... 327/261; 375/224, 233, 340
See application file for complete search history.

(56) References Cited

U.S. PATENT DOCUMENTS

| | | | | |
|---|---|---|---|---|
| 7,606,297 | B2* | 10/2009 | Waschura | H04L 1/24 370/333 |
| 7,640,463 | B2* | 12/2009 | Windler | G01R 31/3171 327/73 |
| 9,148,235 | B1 | 9/2015 | Kang et al. | |
| 9,674,062 | B1* | 6/2017 | Berge | H04L 43/0852 |
| 2005/0027467 | A1* | 2/2005 | Eskeldson | G01R 31/3016 702/64 |
| 2015/0207480 | A1* | 7/2015 | Hoang | H04L 25/03 375/233 |

FOREIGN PATENT DOCUMENTS

| | | |
|---|---|---|
| CN | 1838584 | 9/2006 |
| EP | 2120056 | 11/2010 |
| TW | 200601213 | 1/2006 |

(Continued)

OTHER PUBLICATIONS

Tobias Ellermeyer, et al., "A 10-Gb/s Eye-Opening Monitor IC for Decision-Guided Adaptation of the Frequency Response of an Optical Receiver", IEEE Journal of Solid-State Circuits, vol. 35, No. 12, Dec. 2000, pp. 1958-1963.

(Continued)

*Primary Examiner* — Tomi Skibinski
(74) *Attorney, Agent, or Firm* — JCIPRNET

(57) ABSTRACT

An eye diagram observation device is provided. The eye diagram observation device includes an eye diagram determination circuit and a clock generator. The eye diagram determination circuit obtains an eye diagram corresponding to an input signal pair based on a delayed sampling clock. The clock generator includes a voltage to time converter (VTC). The VTC generates a delayed clock based on a voltage value of an input voltage. The clock generator generates the delayed sampling clock based on the delayed clock. The eye diagram observation device may reduce power consumption and a layout area via the VTC.

20 Claims, 10 Drawing Sheets

(56) References Cited

FOREIGN PATENT DOCUMENTS

| | | |
|---|---|---|
| TW | 201344218 | 11/2013 |
| TW | I580230 | 4/2017 |
| TW | 201815100 | 4/2018 |

OTHER PUBLICATIONS

"Office Action of Taiwan Counterpart Application", dated Apr. 14, 2020, p. 1-p. 8.

* cited by examiner

EYE DIAGRAM OBSERVATION DEVICE

CROSS-REFERENCE TO RELATED APPLICATION

This application claims the priority benefits of U.S. provisional application Ser. No. 62/854,322, filed on May 30, 2019, and Taiwan application serial no. 108127552, filed on Aug. 2, 2019. The entirety of each of the above-mentioned patent applications is hereby incorporated by reference herein and made a part of this specification.

BACKGROUND

Field of the Invention

The invention relates to an observation device and more particularly, to an eye diagram observation device for defining an eye diagram corresponding to an input signal pair.

Description of Related Art

An eye diagram may be used to indicate a performance state of an input signal pair, such as synchronization of the input signal pair, voltage levels of the input signal pair or noise of the input signal pair. An eye diagram observation device may be configured at a signal receiving terminal or on a transmission interface of an electronic apparatus, so as to measure the eye diagram of the input signal pair to determine a state of the input signal pair.

However, various types of delays of sampling clocks of a currently available eye diagram observation device are mostly implemented by a multi-stage ring oscillator. As demands for various types of delays for the sampling clocks increase, the number of inverters required by the ring oscillator also is increased. As result, a layout area of the eye diagram observation device is increased, while power consumption thereof also is increased.

SUMMARY

The invention provides an eye diagram observation device capable of saving power and reducing a layout area.

An eye diagram observation device of an embodiment of the invention is configured to define an eye diagram corresponding to an input signal pair. The eye diagram observation device includes an eye diagram determination circuit and a clock generator. The eye diagram determination circuit is configured to receive a first delayed sampling clock and the input signal pair, compare a first input signal and a second input signal of the input signal pair based on the first delayed sampling clock to obtain a plurality of comparison results and compare the comparison results, so as to obtain the eye diagram corresponding to the input signal pair. The clock generator is coupled to the eye diagram determination circuit. The clock generator includes a voltage to time converter. The voltage to time converter is configured to generate a delayed clock based on a voltage value of an input voltage, wherein a delay time length of the delayed clock is associated with the voltage value of the input voltage. The clock generator generates the first delayed sampling clock based on the delayed clock.

An eye diagram observation device of another embodiment of the invention is configured to define an eye diagram corresponding to an input signal pair. The eye diagram observation device includes an eye diagram determination circuit and a clock generator. The eye diagram determination circuit is configured to receive a reference voltage control clock, a first delayed sampling clock and the input signal pair, provide a plurality of reference signals based on the reference voltage control clock, sequentially compare the input signal pair with the reference signals based on the first delayed sampling clock to obtain a plurality of comparison results and compare the comparison results, so as to obtain the eye diagram corresponding to the input signal pair. The clock generator is coupled to the eye diagram determination circuit. The clock generator is configured to generate the reference voltage control clock and the first delayed sampling clock. The clock generator includes a voltage to time converter. The voltage to time converter is configured to generate a delayed clock based on a voltage value of an input voltage. A delay time length of the delayed clock is associated with the voltage value of the input voltage. The clock generator generates the first delayed sampling clock based on the delayed clock.

To sum up, the delayed sampling clocks of the eye diagram observation device is generated by the voltage to time converter. In comparison with the multi-stage ring oscillator, the voltage to time converter has less power consumption and a smaller layout area. As such, the eye diagram observation device capable of saving power and having a reduced layout area can be accomplished.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
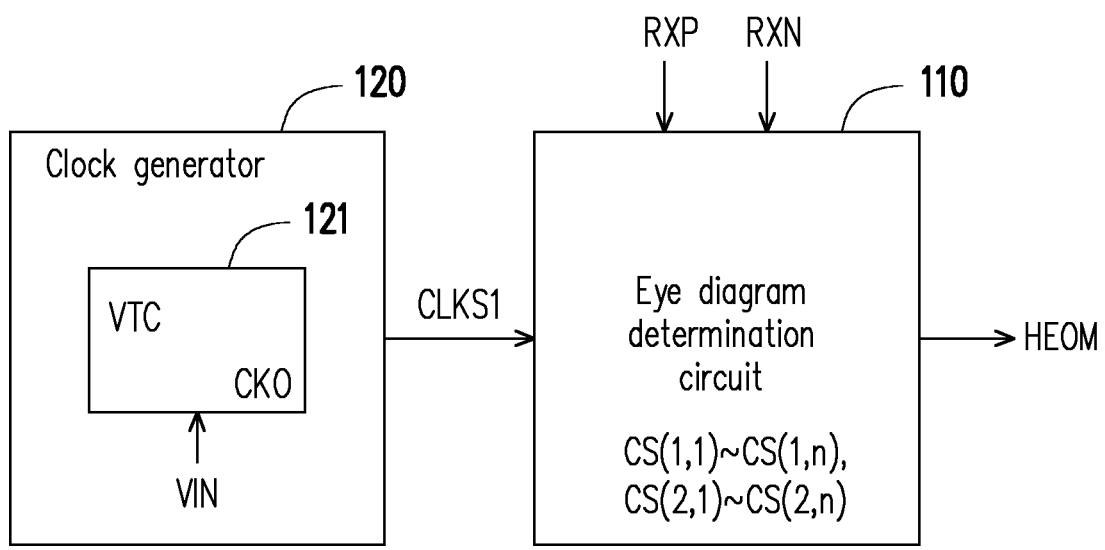
FIG. 1 is a block diagram illustrating an eye diagram observation device according to a first embodiment of the invention.

Referring to FIG. 1, FIG. 1 is a block diagram illustrating an eye diagram observation device according to a first embodiment of the invention. In the present embodiment, an eye diagram observation device 100 includes an eye diagram determination circuit 110 and a clock generator 120. The eye diagram determination circuit 110 receives a first delayed sampling clock CLKS1 and an input signal pair. The input signal pair may be a differential signal pair. The input signal pair includes a first input signal RXP and a second input signal RXN. The eye diagram determination circuit 110 compares the first input signal RXP and the second input signal RXN of the input signal pair based on the first delayed sampling clock CLKS1, so as to obtain comparison results CS(1, 1) to CS(1, n) and CS(2, 1) to CS(2, n). The eye diagram determination circuit 110 compares the comparison results CS(1, 1) to CS(1, n) and CS(2, 1) to CS(2, n), so as to obtain an eye diagram HEOM corresponding to the input signal pair.

In the present embodiment, the clock generator 120 is coupled to the eye diagram determination circuit 110. The clock generator 120 includes a voltage to time converter (VTC) 121. The VTC 121 generates a delayed clock CKO according to a voltage value of an input voltage VIN. A delay time length of the delayed clock CKO is associated with the voltage value of the input voltage VIN. The clock generator 120 generates the first delayed sampling clock CLKS1 according to the delayed clock CKO.

It is to be mentioned that in the present embodiment, the clock generator 120 provides the delayed clock CKO via the VTC 121. In comparison with the multi-stage ring oscillator, the VTC 121 has less power consumption and a smaller layout area. In this way, the eye diagram observation device 100 with saved power consumption and a reduced layout area may be accomplished.

Figure 2:
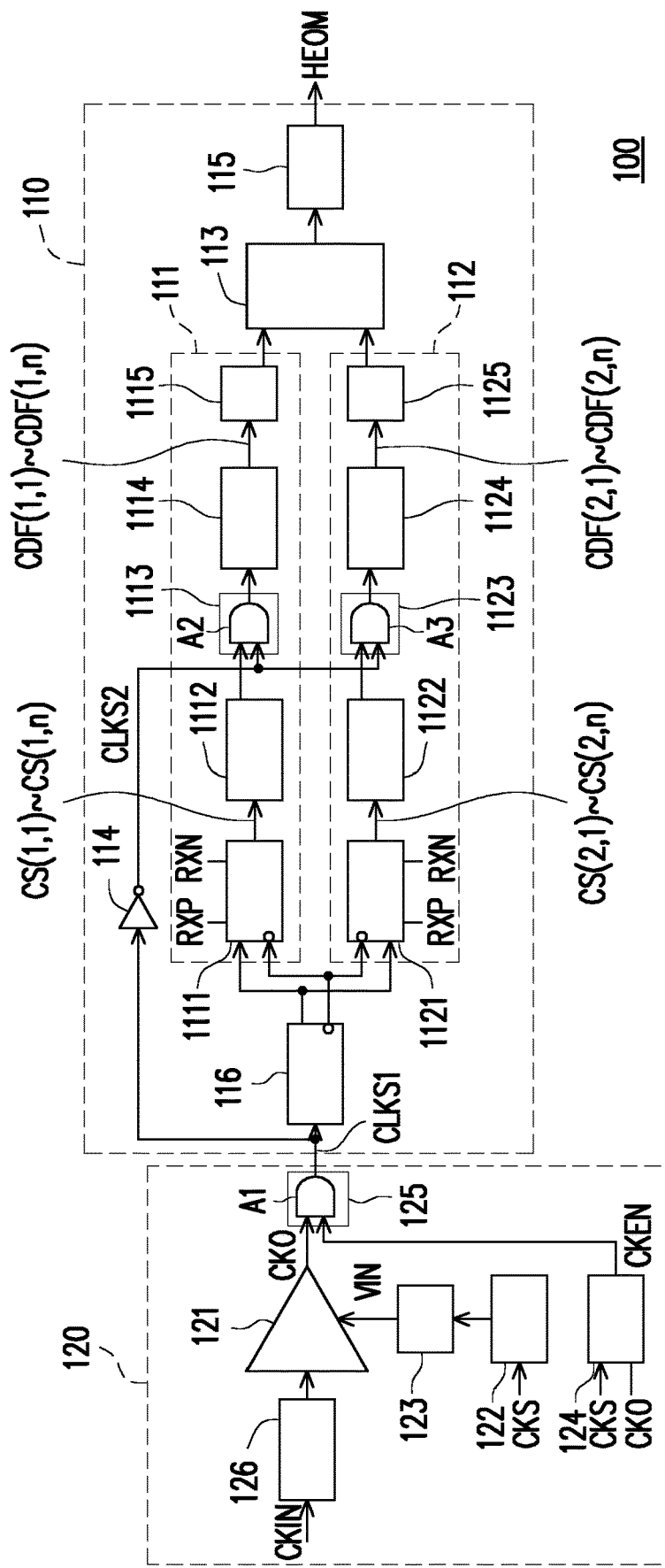
FIG. 2 is a schematic circuit diagram illustrating the eye diagram observation device according to the embodiment depicted in FIG. 1.

Furthermore, referring to FIG. 2, FIG. 2 is a schematic circuit diagram illustrating the eye diagram observation device according to the embodiment depicted in FIG. 1. In the present embodiment, in addition to the VTC 121, the clock generator 120 further includes a clock counter 122 and a format conversion circuit 123. The clock counter 122 receives a reference clock CKS and counts the reference clock to obtain a count value. The clock counter 122 may count a number of occurrence times of a rising edge or a number of occurrence times of a falling edge of the reference clock CKS. In the present embodiment, the clock counter 122 is triggered by the rising edge of the reference clock CKS to count up the count value. In the present embodiment, the format conversion circuit 123 is coupled to the clock counter 122 and the VTC 121. The format conversion circuit 123 receives the count value provided from the clock counter 122 and provides the input voltage VIN according to the count value. The voltage value of the input voltage VIN is associated with the count value. For example, as the number of the rising edges of the reference clock CKS is increased, the count value of the clock counter 122 also is increased, and the voltage value of the input voltage VIN is increased as well. Thus, the input voltage VIN is a gradually increased voltage. Once an overflow occurs to the clock counter 122, the count value is reset, and the voltage value of the input voltage VIN returns to an initial preset value.

Figure 3:
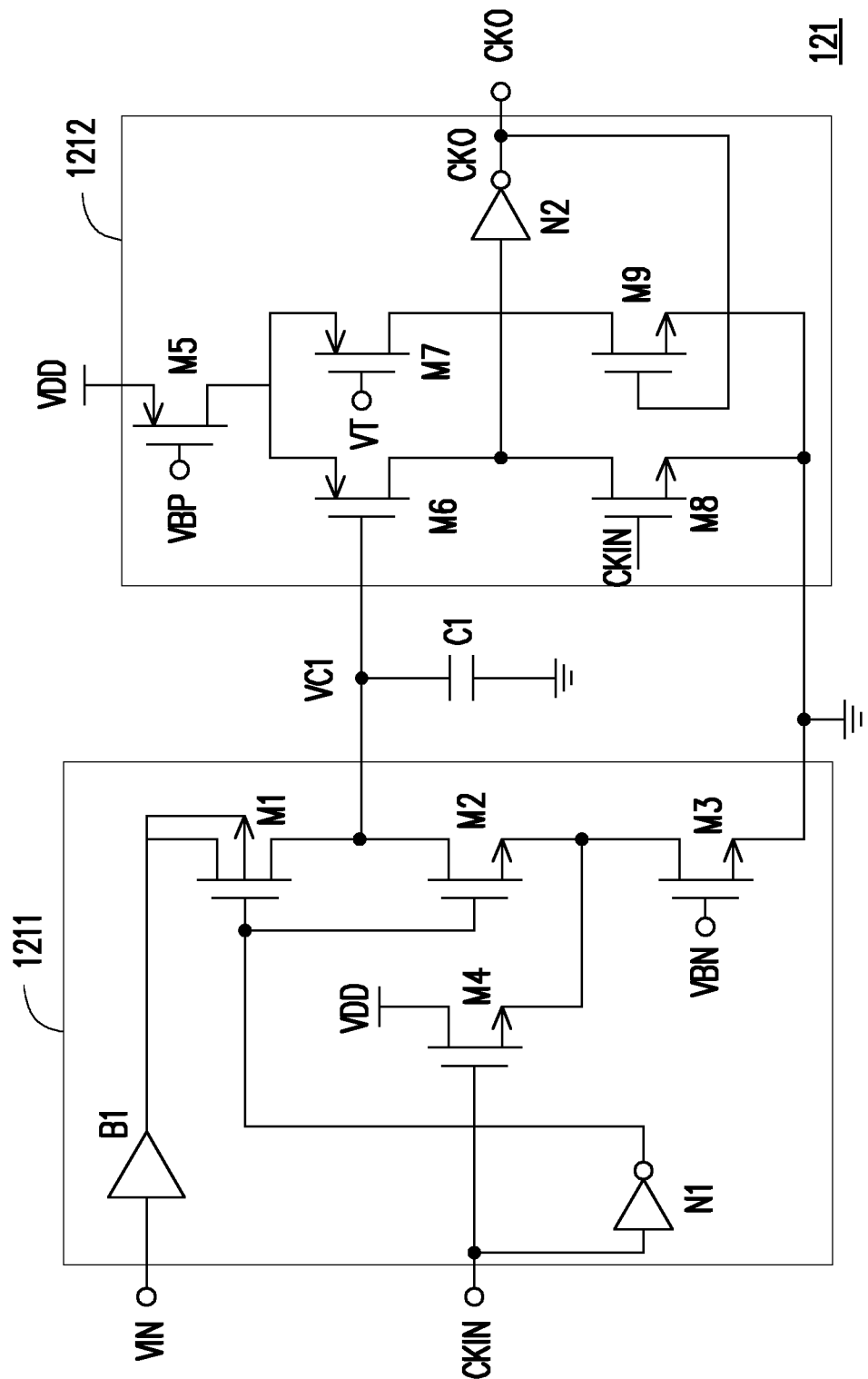
FIG. 3 is a schematic circuit diagram illustrating the voltage to time converter according to an embodiment of the invention.

In the present embodiment, the VTC 121 generates the delayed clock CKO according to the voltage value of the input voltage VIN. Referring to FIG. 3, FIG. 3 is a schematic circuit diagram illustrating the VTC according to an embodiment of the invention. In the present embodiment, the VTC 121 includes an input stage circuit 1211, a capacitor C1 and an output stage circuit 1212. The input stage circuit 1211 serves the input voltage VIN as a conversion voltage VC1 based on an external clock CKIN. A first terminal of the capacitor C1 is coupled to the input stage circuit 1211 to receive the conversion voltage VC1. A second terminal of the capacitor C1 is coupled to a reference low voltage level (e.g., a grounding voltage). The output stage circuit 1212 is coupled to the first terminal of the capacitor C1 and the input stage circuit 1211. The output stage circuit 1212 provides the delayed clock CKO according to a voltage value of the conversion voltage VC1 and a voltage value of a predetermined voltage VT.

In the present embodiment, the input stage circuit 1211 includes an inverter N1, a first input stage transistor M1, a second input stage transistor M2, a third input stage transistor M3 and a fourth input stage transistor M4. An input terminal of the inverter N1 is employed to receive the external clock CKIN. A first terminal of the first input stage transistor M1 is employed to receive the input voltage VIN. A second terminal of the first input stage transistor M1 is coupled to the first terminal of the capacitor C1. A control terminal of the first input stage transistor M1 is coupled to an output terminal of the inverter N1. A first terminal of the second input stage transistor M2 is coupled to the second terminal of the first input stage transistor M1. A control terminal of the second input stage transistor M2 is coupled to the output terminal of the inverter N1. A first terminal of the third input stage transistor M3 is coupled to a second terminal of the second input stage transistor M2. A second terminal of the third input stage transistor M3 is coupled to the reference low voltage level. A control terminal of the third input stage transistor M3 is employed to receive a bias voltage VBN. The third input stage transistor M3 is configured as a current source. A first terminal of the fourth input stage transistor M4 is employed to receive a reference high voltage level VDD. A second terminal of the fourth input stage transistor M4 is coupled to the second terminal of the second input stage transistor M2. A control terminal of the fourth input stage transistor M4 is employed to receive the external clock CKIN. The first input stage transistor M1 of the present embodiment may be implemented by, for example, a P-type metal-oxide-semiconductor field-effect transistor (MOSFET). The second input stage transistor M2, the third input stage transistor M3 and the fourth input stage transistor M4 of the present embodiment may be implemented by, for example, N-type MOSFETs.

In the present embodiment, the input stage circuit 1211 may further include a buffer B1 (which is not limited in the invention). According to a circuit design demand, the buffer B1 may maintain or gain the input voltage VIN. The first terminal of the first input stage transistor M1 may receive the input voltage VIN through the buffer B1.

In the present embodiment, the output stage circuit 1212 includes a first output stage transistor M5, a second output stage transistor M6, a third output stage transistor M7, a fourth output stage transistor M8, a fifth output stage transistor M9 and an inverter N2. A first terminal of the first output stage transistor M5 is employed to receive the reference high voltage level VDD. A control terminal of the first output stage transistor M5 is employed to receive a bias voltage VBP. The first output stage transistor M5 is configured as a current source. A first terminal of the second output stage transistor M6 is coupled to a second terminal of the first output stage transistor M5, and a control terminal of the second output stage transistor M6 is coupled to the first terminal of the capacitor C1. A first terminal of the third output stage transistor M7 is coupled to the second terminal of the first output stage transistor M5, and a control terminal of the third output stage transistor M7 is employed to receive the predetermined voltage VT. A first terminal of the fourth output stage transistor M8 is coupled to a second terminal of the second output stage transistor M6. The second terminal of the fourth input stage transistor M4 is coupled to the reference low voltage level. A control terminal of the fourth output stage transistor M8 is employed to receive the external clock CKIN. An input terminal of the inverter N2 is coupled to the second terminal of the second output stage transistor M6. An output terminal of the inverter N2 is employed as an output terminal of the VTC 121. A first terminal of the fifth output stage transistor M9 is coupled to a second terminal of the third output stage transistor M7. A second terminal of the fifth output stage transistor M9 is coupled to the reference low voltage level. The first terminal of the fifth output stage transistor M9 is coupled to the output terminal of the inverter N2. The first output stage transistor M5, the second output stage transistor M6 and the third output stage transistor M7 of the present embodiment may be implemented by, for example, P-type MOSFETs. The fourth output stage transistor M8 and the fifth output stage transistor M9 of the present embodiment may be implemented by, for example, N-type MOSFETs.

Figure 4:
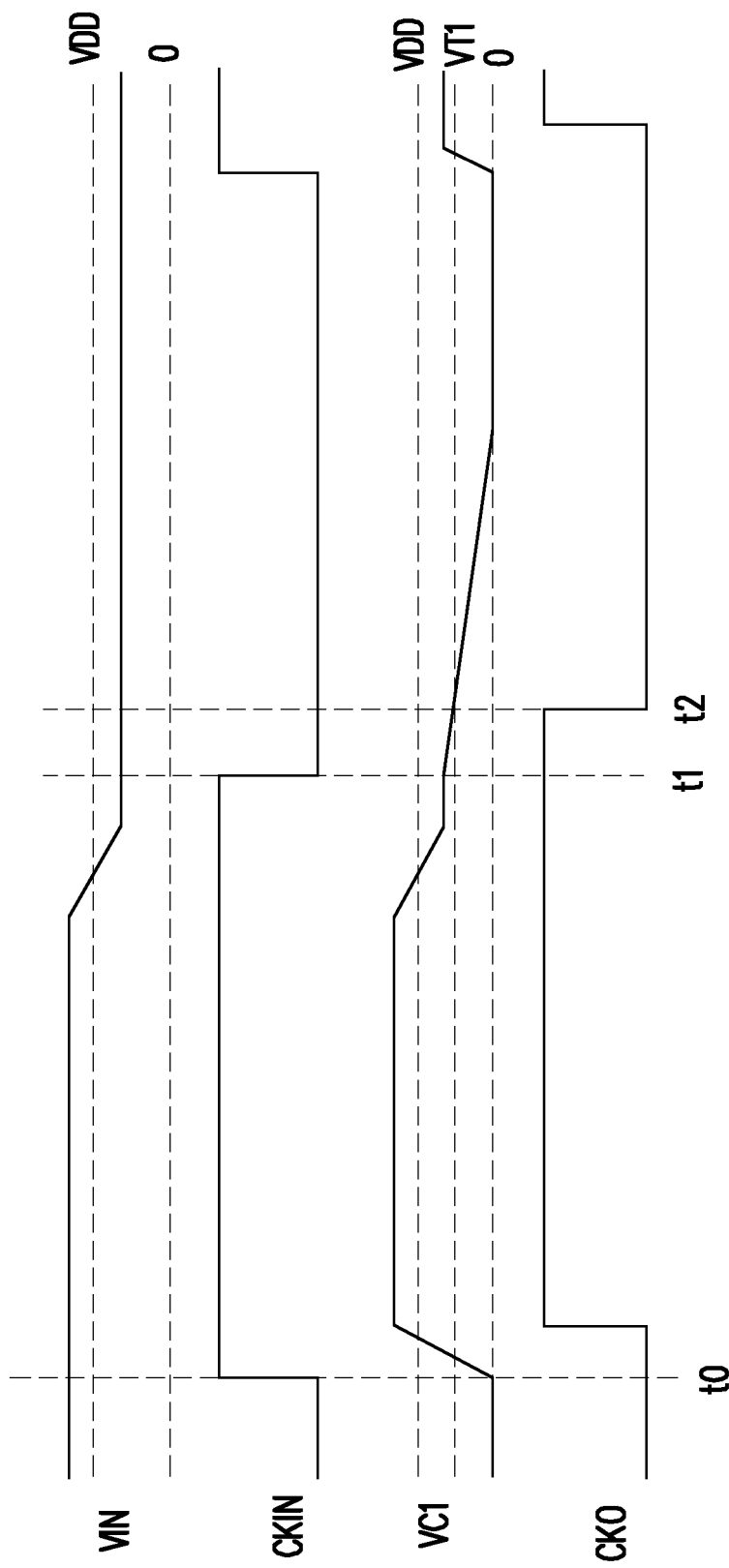
FIG. 4 illustrates a schematic waveform diagram according to an embodiment of the invention.

Referring to FIG. 3 and FIG. 4, FIG. 4 illustrates a schematic waveform diagram according to an embodiment of the invention. In the present embodiment, at a time point t0, the external clock CKIN is transited into a high logical level. After the time point t0, the first input stage transistor M1 is turned on to serve the input voltage VIN as the conversion voltage VC1, and the conversion voltage VC1 is provided to the first terminal of the capacitor C1. Thus, a voltage level of the first terminal of the capacitor C1 is boosted up to a voltage level of the conversion voltage VC1, and the second input stage transistor M2 is turned off. Thus, the conversion voltage VC1 is maintained. Moreover, the third input stage transistor M3 and the fourth input stage transistor M4 are turned on. Thus, a voltage level of the second terminal of the second input stage transistor M2 may be maintained. In the present embodiment, the voltage value of the input voltage VIN may be set to be greater than a voltage value of the reference high voltage level VDD. For example, the voltage value of the reference high voltage level VDD is 1.05 volts. A setting range of the voltage value of the input voltage VIN may be set to 0.8 to 1.2 volts.

In this circumstance, the third output stage transistor M7 is turned on according to the predetermined voltage VT. The fourth output stage transistor M8 is turned on according to the external clock CKIN at the high logical level. Moreover, because the conversion voltage VC1 is boosted up, the second output stage transistor M6 is turned off. A current provided by the first output stage transistor M5 flows through the third output stage transistor M7. The voltage level of the second terminal of the second output stage transistor M6 is a low voltage level. A voltage level of the output terminal of the inverter N2 is transited into a high voltage level. Thus, a logical level of the delayed clock CKO is transited into a high logical level.

At a time point t1, the external clock CKIN is transited from the high logical level into a low logical level. After the time point t1, the first input stage transistor M1 and the fourth input stage transistor M4 are turned off, and the second input stage transistor M2 is turned on. Thus, the second input stage transistor M2 and the third input stage transistor M3 form a discharge path having a fixed discharge current to discharge the first terminal of the capacitor C1. Thus, the voltage value of the conversion voltage VC1 is dropped down, and the fourth output stage transistor M8 is turned off. The voltage level of the conversion voltage VC1 is dropped down to turn on the second output stage transistor M6. In a condition that the voltage level of the conversion voltage VC1 is still greater than the predetermined voltage VT, the current provided by the first output stage transistor M5 still flows through the third output stage transistor M7. The voltage level of the second terminal of the second output stage transistor M6 is the low voltage level. Thus, the voltage level of the output terminal of the inverter N2 is the high voltage level. The voltage level of the conversion voltage VC1 is continuously dropped down and is less than the predetermined voltage VT at a time point t2.

In the present embodiment, in order to ensure that the first input stage transistor M1 is completely turned off at the time point t1, the first input stage transistor M1 is designed with a greater threshold voltage value. The threshold voltage value of the first input stage transistor M1 is greater than threshold voltage values of the first output stage transistor M5, the second output stage transistor M6 and the third output stage transistor M7.

At the time point t2, the current provided by the first output stage transistor M5 starts to flow through the second output stage transistor M6. The voltage level of the second terminal of the second output stage transistor M6 is boosted up, such that the voltage level of the output terminal of the inverter N2 is transited into a low voltage level. In the meantime, the fifth output stage transistor M9 is turned off, such that the current provided by the first output stage transistor M5 is capable of flowing through the second output stage transistor M6. In the present embodiment, a time difference between the time point t2 and the time point t1 is a time length that the VTC 121 delays the falling edge of the delayed clock CKO.

It should be noted that a discharge rate of the conversion voltage VC1 is associated with the discharge current and a capacitance of the capacitor C1. Thus, in the presence of the fixed discharge current, the discharge rate of the conversion voltage VC1 is fixed. Thus, as the voltage value of the conversion voltage VC1 is increased, a discharge time of the conversion voltage VC1 is longer, and the time length that the VTC 121 delays the falling edge of the delayed clock CKO is also longer.

Figure 5:
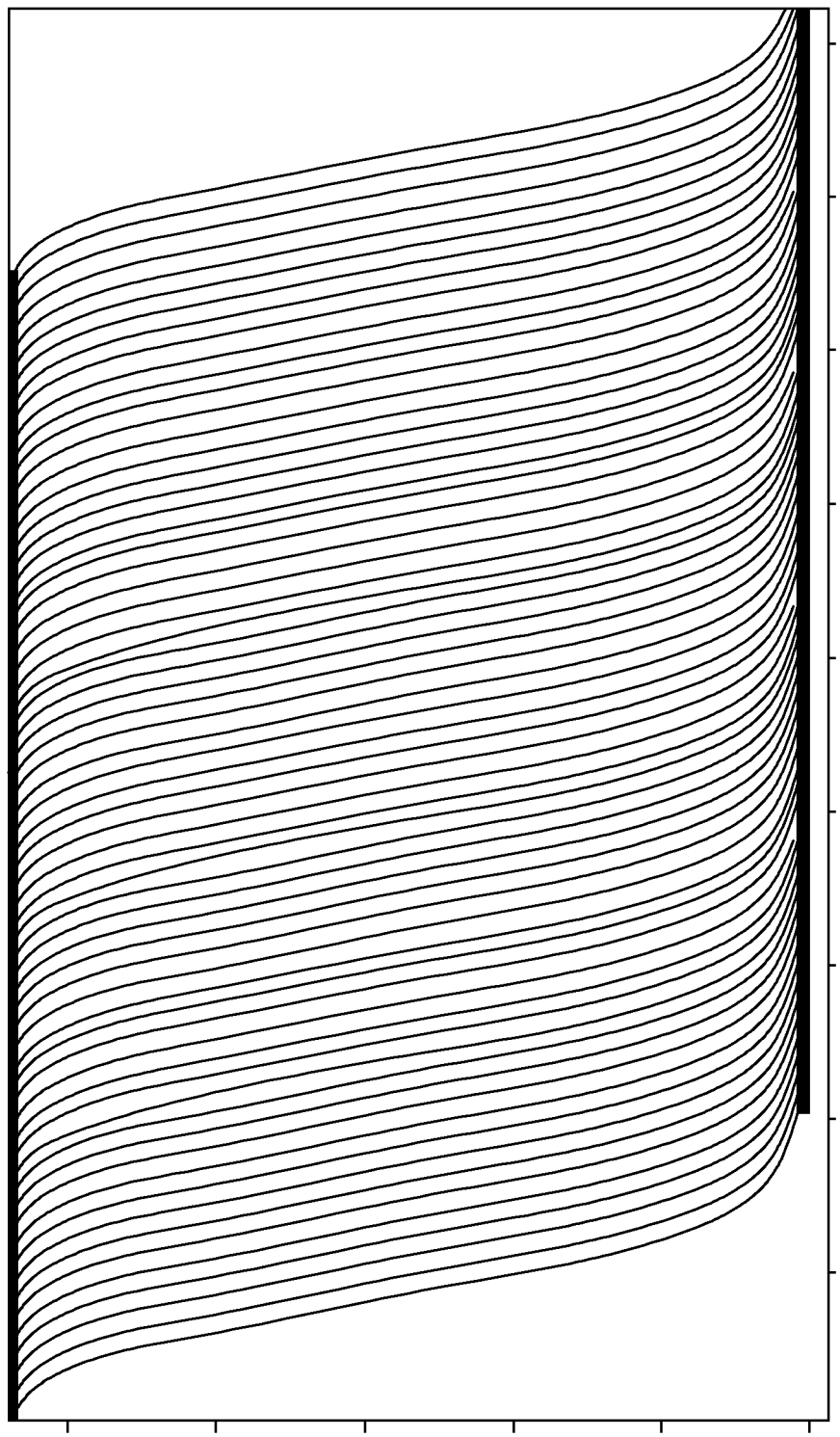
FIG. 5 is a schematic waveform diagram illustrating the delayed clock according to an embodiment of the invention.

Referring to FIG. 5, FIG. 5 is a schematic waveform diagram illustrating the delayed clock according to an embodiment of the invention. FIG. 5 illustrates that the delay of the falling edge of the delayed clock CKO is adjustable.

Returning to the embodiment illustrated in FIG. 2, the clock counter 122 may be a 6-bit counter (which is not limited in the invention). Thus, the format conversion circuit 123 may generate the input voltage VIN having 64 different voltage values. Thus, the VTC 121 may delay the delayed clock CKO according to the bits of the clock counter 122 in 64 different manners. Accordingly, the VTC 121 may substitute for the multi-stage ring oscillator.

In the present embodiment, the clock generator 120 further includes an enable clock generator 124 and a logical circuit 125 (but the invention is not limited thereto). In the present embodiment, the enable clock generator 124 generates an enable clock CKEN according to the reference clock CKS and the delayed clock CKO. The logical circuit 125 is coupled to the enable clock generator 124, the VTC 121 and the eye diagram determination circuit 110. The logical circuit 125 performs a logical operation on the enable clock CKEN and the delayed clock CKO to generate the first delayed sampling clock CLKS1.

Figure 6:
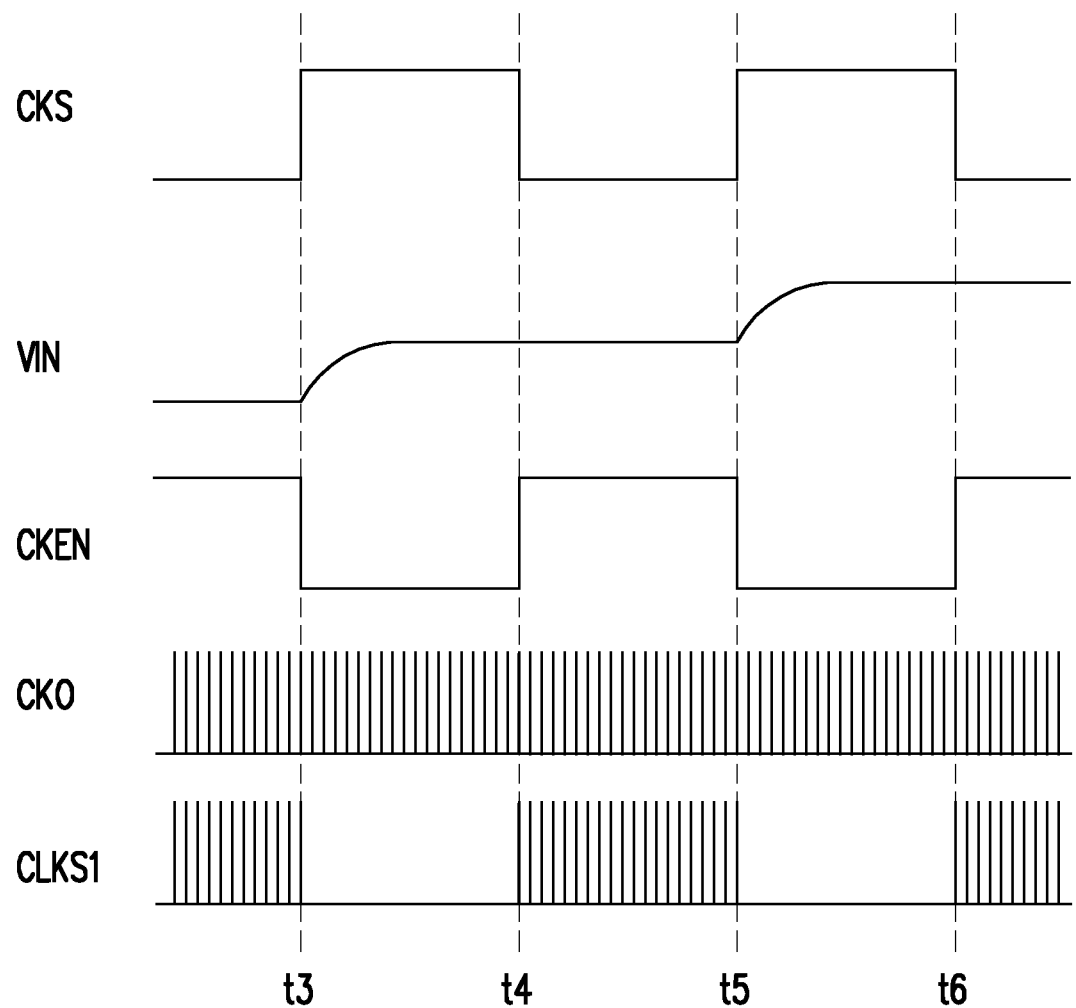
FIG. 6 is a schematic waveform diagram illustrating the enable clock and the first delayed sampling clock according to an embodiment of the invention.

Referring to FIG. 2 and FIG. 6, FIG. 6 is a schematic waveform diagram illustrating the enable clock and the first delayed sampling clock according to an embodiment of the invention. In the present embodiment, the enable clock generator 124 receives the reference clock CKS and the delayed clock CKO. A frequency of the delayed clock CKO is greater than a frequency of the reference clock CKS. For example, the frequency of the delayed clock CKO is about 1 GHz, and the frequency of the reference clock CKS is about 1 MHz. The enable clock generator 124 inverts the reference clock CKS to generate an inverted reference clock. The enable clock generator 124 performs a logical AND operation on the inverted reference clock and the delayed clock CKO to generate the enable clock CKEN. The enable clock CKEN is capable of synchronizing with the rising edge of the delayed clock CKO.

In the present embodiment, the logical circuit 125 at least includes an AND logical gate A1. A first input terminal of the AND logical gate A1 is employed to receive the delayed clock CKO. A second input terminal of the AND logical gate A1 is employed to receive the enable clock CKEN. The AND logical gate A1 performs the logical AND operation on the enable clock CKEN and the delayed clock CKO to generate the first delayed sampling clock CLKS1.

It is to be mentioned that for example, the clock counter 122 is triggered by the rising edge of the reference clock CKS to count up the count value. The format conversion circuit 123 generates the input voltage VIN according to the count value. Thus, the format conversion circuit 123 is triggered, for example, according to the rising edge of the reference clock CKS to generate the input voltage VIN at a time point t3. Thus, when the reference clock CKS is at a high logical level, a voltage level of the input voltage VIN may not yet reach an expected voltage level. When the reference clock CKS is at a low logical level, the voltage level of the input voltage VIN may have reached the expected voltage level (at a time point t4). Accordingly, if the sampling is performed during a time zone between the time point t3 and the time point t4, the instable input voltage VIN may cause an instable delay to the delayed clock CKO. The enable clock CKEN and the first delayed sampling clock CLKS1 of the present embodiment may be maintained at the low logical levels when the reference clock CKS is at the high logical level. In this way, the eye diagram determination circuit 110 is ensured to compare the first input signal RXP and the second input signal RXN based on the a plurality of delays that the first delayed sampling clock CLKS1 goes through during the time zone in which the input voltage VIN is at a stable voltage level, so as to obtain a comparing result.

Returning to FIG. 2, the clock generator 120 further includes an external clock delay circuit 126 (but the invention is not limited thereto). The external clock delay circuit 126 may be controlled to delay (or adjust) a time at which the external clock CKIN is generated, thereby adjusting a relative time between the first delayed sampling clock CLKS1 and the input signal to adjust a horizontal position of the eye diagram.

In the present embodiment, the eye diagram determination circuit 110 includes a first count value generator 111, a second count value generator 112, a logical circuit 112 and an inverter 114. The first count value generator 111 is coupled to the clock generator 120. The first count value generator 111 obtains the first comparison results CS(1, 1) to CS(1, n) among the comparison results CS(1, 1) to CS(1, n) and CS(2, 1) to CS(2, n) based on the first delayed sampling clock CLKS1 when a voltage level of the first input signal RXP is equal to a voltage level of the second input signal RXN and counts a number of occurrence times of each of the first comparison results CS(1, 1) to CS(1, n), so as to obtain first count values CDF(1, 1) to CDF(1, n) respectively corresponding to the first comparison results CS(1, 1) to CS(1, n) and CS(1, 1) to CS(1, n). For example, the first count value CDF(1, 1) corresponds to the first comparison result CS(1, 1), the first count value CDF(1, 2) corresponds to the first comparison result CS(1, 2), and the rest may be derived by analog.

In the present embodiment, the second count value generator 112 is coupled to the clock generator 120. The second count value generator 112 obtains the second comparison results CS(2, 1) to CS(2, n) among the comparison results CS(1, 1) to CS(1, n) and CS(2, 1) to CS(2, n) based on the first delayed sampling clock CLKS1 when a difference between the voltage level of the first input signal RXP and the voltage level of the second input signal RXN is equal to a preset value and counts a number of occurrence times of each of the second comparison results CS(2, 1) to CS(2, n), so as to obtain second count values CDF(2, 1) to CDF(2, n) respectively corresponding to the second comparison results CS(2, 1) to CS(2, n). For example, the second count value CDF(2, 1) corresponds to the second comparison result CS(2, 1), the second count value CDF(2, 2) corresponds to the second comparison result CS(2, 2), and the rest may be derived by analog.

In the present embodiment, the logical circuit 113 is coupled to the first count value generator 111 and the second count value generator 112. The logical circuit 113 provides eye diagram information according to the first count values CDF(1, 1) to CDF(1, n) and the second count values CS(2, 1) to CS(2, n). The inverter 114 is coupled to the clock generator 120. The inverter 114 inverts the first delayed sampling clock CLKS1 to generate a second delayed sampling clock CLKS2.

Regarding the first count value generator 111, the first count value generator 111 includes a first comparing unit 1111, a first format conversion circuit 1112, a first sampling circuit 1113, a first counter 1114 and a first count value output unit 1115. The first comparing unit 1111 is coupled to the clock generator 120. In the present embodiment, the first comparing unit 1111 receives the first delayed sampling clock CLKS1, the first input signal RXP and the second input signal RXN and obtains the comparison results CS(1, 1) to CS(1, n) based on the first delayed sampling clock CLKS1 when the voltage level of the first input signal RXP is equal to the voltage level of the second input signal RXN. For example, when the first delayed sampling clock CLKS1 goes through a first delay, the first comparing unit 1111 obtains the comparison result CS(1, 1) when the voltage level of the first input signal RXP is equal to the voltage level of the second input signal RXN. When the first delayed sampling clock CLKS1 goes through a second delay after the first delay, the first comparing unit 1111 obtains the comparison result CS(1, 2) when the voltage level of the first input signal RXP is equal to the voltage level of the second input signal RXN, and the rest may be derived by analog. Taking the comparison result CS(1, 1) as an example, a plurality of determination results corresponding to the comparison result CS(1, 1) may be obtained for the CS(1, 1) based on a plurality of triggers of the first delayed sampling clock CLKS1. Furthermore, for example, when the first delayed sampling clock CLKS1 goes through the first delay, if the voltage level of the first input signal RXP is obviously different from (obviously greater than or obviously less than) the voltage level of the second input signal RXN, the comparison result CS(1, 1) includes a plurality of substantially the same determination results. On the other hand, if the voltage level of the first input signal RXP is close to the voltage level of the second input signal RXN, the comparison result CS(1, 1) includes a plurality of different determination results.

In the present embodiment, the first format conversion circuit 1112 is coupled to the first comparing unit 1111 to convert each of the comparison results CS(1, 1) to CS(1, n) into a first comparative logical result. The first format conversion circuit 1112 may convert each of the comparison results CS(1, 1) to CS(1, n) in an analog signal format into the first comparative logical result in a digital format. Namely, the first format conversion circuit 1112 may convert the substantially the same determination results corresponding to the comparison results CS(1, 1) to CS(1, n) in the analog signal format into the first comparative logical results in the digital format. The first sampling circuit 1113 is coupled to the inverter 114 and the first format conversion circuit 1112. The first sampling circuit 1113 samples the first comparative logical results based on the second delayed sampling clock CLKS2, so as to obtain first sampling results corresponding to the comparison results CS(1, 1) to CS(1, n). The first sampling circuit 1113 provides the first sampling results based on the second delayed sampling clock CLKS2. That is to say, the first count value generator 111 sequentially obtains the comparison results CS(1, 1) to CS(1, n) according to a plurality of delays that the first delayed sampling clock CLKS1 goes through and provides a plurality of first sampling results associated with the comparison results CS(1, 1) to CS(1, n). In the present embodiment, the first sampling circuit 1113 at least includes an AND logical gate A2. A first input terminal of the AND logical gate A2 is coupled to the first format conversion circuit 1112. A second input terminal of the AND logical gate A2 is coupled to an output terminal of the inverter 114. An output terminal of the AND logical gate A2 is employed to provide the first sampling results corresponding to the comparison results CS(1, 1) to CS(1, n).

The first counter 1114 is coupled to the first sampling circuit 1113. The first counter 1114 counts the first sampling results to obtain the first count values CDF(1, 1) to CDF(1, n) associated with the first comparison results CS(1, 1) to CS(1, n). For example, the first counter 1114 obtains the first count value CDF(1, 1) corresponding to a specific logical value (e.g., logical 1) of the first comparative logical result associated with the first comparison result CS(1, 1), obtains the first count value CDF(1, 2) corresponding to a specific logical value (e.g., logical 1) of the first comparative logical result associated with the first comparison result CS(1, 2), and the rest may be derived by analog.

The first count value output unit 1115 is coupled to the first counter 1114. The first count value output unit 1115 receives the first count values CDF(1, 1) to CDF(1, n) and outputs the first count values CDF(1, 1) to CDF(1, n) in response to the control of the first counter 1114. The first count value output unit 1115 sequentially outputs the first count values CDF(1, 1) to CDF(1, n). For example, the first counter 1114 may provide a control signal to instruct the first count value output unit 1115 to sequentially output the first count values CDF(1, 1) to CDF(1, n). In the present embodiment, a time point at which the control signal occurs may be consist with a falling edge of the enable clock CKEN, and thus, the first count value output unit 1115 outputs the first count values CDF(1, 1) to CDF(1, n) at the time point of the falling edge of the enable clock CKEN. In some embodiments, the first count value output unit 1115 may be implemented by at least one flipflop.

Regarding the second count value generator 112, the second count value generator 112 includes a second comparing unit 1121, a second format conversion circuit 1122, a second sampling circuit 1123, a second counter 1124 and a second count value output unit 1125. The second comparing unit 1121 is coupled to the clock generator 120. The second comparing unit 1121 receives the first delayed sampling clock CLKS1, the first input signal RXP and the second input signal RXN and obtains the second comparison results CS(2, 1) to CS(2, n) based on the first delayed sampling clock CLKS1 when an absolute value of the difference between the voltage level of the first input signal RXP and the voltage level of the second input signal RXN is equal to a preset value. In the present embodiment, the preset value may be, for example, 1 mV, but the invention is not limited thereto. For example, when the first delayed sampling clock CLKS1 goes through the first delay, the second comparing unit 1121 obtains the comparison result CS(2, 1) when the absolute value of the difference between the voltage level of the first input signal RXP and the voltage level of the second input signal RXN is equal to the preset value. During the second delay, the second comparing unit 1121 obtains the comparison result CS(2, 2) when the absolute value of the difference between the voltage level of the first input signal RXP and the voltage level of the second input signal RXN is equal to the preset value, and the rest may be derived by analog. Taking the comparison result CS(2, 1) as an example, a plurality of determination results corresponding to the comparison result CS(2, 1) may be obtained for the comparison result CS(2, 1) based on the plurality of triggers of the first delayed sampling clock CLKS1. Moreover, for example, when the first delayed sampling clock CLKS1 goes through the first delay, if the absolute value of the difference between the voltage level of the first input signal RXP and the voltage level of the second input signal RXN is obviously different from (obviously greater than or obviously less than) the preset value, the comparison result CS(2, 1) includes a plurality of substantially the same determination results. On the other hand, if the absolute value of the difference between the voltage level of the first input signal RXP and the voltage level of the second input signal RXN is close to the preset value, the comparison result CS(2, 1) includes a plurality of different determination results.

In the present embodiment, the second format conversion circuit 1122 is coupled to the second comparing unit 1121 to convert each of the comparison results CS(2, 1) to CS(2, n) into a second comparative logical result. The second format conversion circuit 1122 may convert each of the comparison results CS(2, 1) to CS(2, n) in an analog signal format into the second comparative logical result in a digital format. Namely, the second format conversion circuit 1122 may convert the substantially the same determination results corresponding to the comparison results CS(2, 1) to CS(2, n) in the analog signal format into the second comparative logical results in the digital format. The second sampling circuit 1123 is coupled to the inverter 114 and the second format conversion circuit 1122. The second sampling circuit 1123 samples the first comparative logical results based on the second delayed sampling clock CLKS2, so as to obtain second sampling results corresponding to the comparison results CS(2, 1) to CS(2, n). The second sampling circuit 1123 provides the second sampling results based on the rising edge of the second delayed sampling clock CLKS2. That is to say, the second count value generator 112 obtains the comparison results CS(2, 1) to CS(2, n) at the falling edge of the first delayed sampling clock CLKS1 and provides a plurality of second sampling results associated with the comparison results CS(2, 1) to CS(2, n) based on a plurality of falling edges of a plurality of delays that the first delayed sampling clock CLKS1 goes through. In the present embodiment, the second sampling circuit 1123 may at least include an AND logical gate A3. A first input terminal of the AND logical gate A3 is coupled to the second format conversion circuit 1122. A second input terminal of the AND logical gate A3 is coupled to the output terminal of the inverter 114. An output terminal of the AND logical gate A3 is employed to provide the second sampling results corresponding to the comparison results CS(2, 1) to CS(2, n).

The second counter 1124 is coupled to the second sampling circuit 1123. The second counter 1124 counts the second sampling results to obtain the second count values CDF(2, 1) to CDF(2, n) associated with the second comparison results CS(2, 1) to CS(2, n). For example, the second counter 1124 obtains the second count value CDF(2, 1) corresponding to a specific logical value (e.g., logical 1) of the second comparative logical result associated with the second comparison result CS(2, 1), obtains the second count value CDF(2, 2) corresponding to a specific logical value (e.g., logical 1) of the second comparative logical result associated with the second comparison result CS(2, 2), and the rest may be derived by analog.

The second count value output unit 1125 is coupled to the second counter 1124. The second count value output unit 1125 receives the second count values CDF(2, 1) to CDF(2, n) and outputs the second count values CDF(2, 1) to CDF(2, n) in response to the control of the second counter 1124. The second count value output unit 1125 sequentially outputs the second count values CDF(2, 1) to CDF(2, n). For example, the second counter 1124 may provide a control signal to instruct the second count value output unit 1125 to sequentially output the second count values CDF(2, 1) to CDF(2, n). In the present embodiment, a time point at which the control signal occurs may be consist with the falling edge of the enable clock CKEN, and thus, the second count value output unit 1125 outputs the second count values CDF(2, 1) to CDF(2, n) at the time point of the falling edge of the enable clock CKEN. In some embodiments, the second count value output unit 1125 may be implemented by at least one flipflop.

Regarding the logical circuit 113, for example, the logical circuit 113 provides a first part of information of an eye diagram corresponding to the first delay according to a difference between the first count value CDF(1, 1) and the second count value CS(2, 1). The logical circuit 113 may perform a logical XOR operation on the first count value CDF(1, 1) and the second count value CDF(2, 1) to provide the first part of the information. The logical circuit 113 may perform a logical XOR operation on the first count value CDF(1, 2) and the second count value CDF(2, 2) to provide a second part of the information, and the rest may be deduced by analog. The logical circuit 113 may provide a plurality of parts of the information of the eye diagram respectively corresponding to a plurality of delays (e.g., based on a plurality of delays that the first delayed sampling clock CLKS1 goes through). The first count values CDF(1, 1) to CDF(1, n) and the second count values CDF(2, 1) to CDF(2, n) may be respectively considered as cumulative distribution functions, and the plurality of parts of the information of the eye diagram may be respectively considered as probability density functions.

The eye diagram determination circuit 110 further includes an eye diagram forming unit 115. The eye diagram forming unit 115 forms a one-dimensional (1-D) eye diagram HEOM corresponding to the input signal pair by integrating the plurality of parts of the information. In some embodiments, the eye diagram forming unit 115 may be disposed outside the eye diagram observation circuit 100. The invention is not limited to the eye diagram determination circuit including the eye diagram forming unit.

Figure 7:
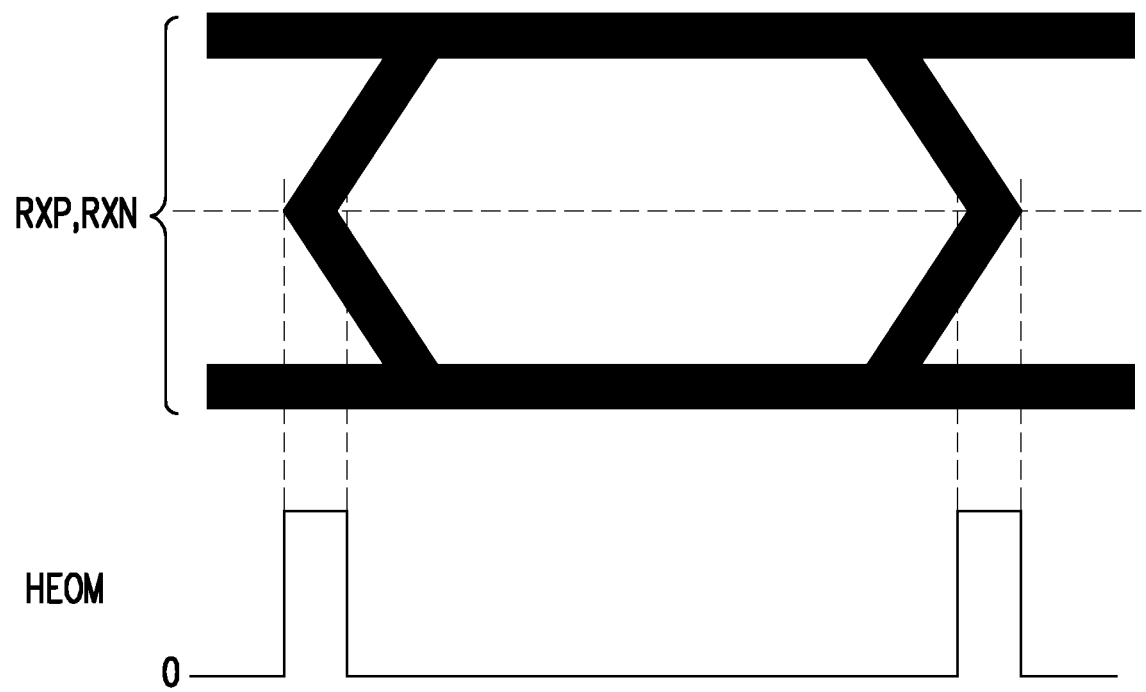
FIG. 7 illustrates an eye diagram according to the first embodiment of the invention.

Referring to FIG. 2 and FIG. 7, FIG. 7 illustrates an eye diagram according to the first embodiment of the invention. In the present embodiment, in some delays, when the absolute value of the difference between the voltage level of the first input signal RXP and the voltage level of the second input signal RXN is equal to the preset value, the second count value is obviously greater than the first count value. Thus, the logical circuit 113 provides non-zero parts of the information. In some delays, when the voltage level of the first input signal RXP is equal to the voltage level of the second input signal RXN, the first count value is obviously greater than the second count value. Thus, the logical circuit 113 also provides the non-zero parts of the information. In other delays, the first count value is equal to the second count value. Thus, the logical circuit 113 also provides zero parts of the information. The eye diagram forming unit 115 may also form the 1-D eye diagram HEOM. In addition, the eye diagram forming unit 115 may also measure an "eye opening" state of the eye diagram according to the number of the zero parts of the information.

In some embodiments, according to a demand of a circuit aspect of the first comparing unit 1111 and the second comparing unit 1121, the eye diagram determination circuit 110 may further include a clock format conversion circuit 116 (but the invention is not limited in this regard). The clock format conversion circuit 116 generates a complementary clock of the first delayed sampling clock CLKS1 according to the first delayed sampling clock CLKS1 and provides the first delayed sampling clock CLKS1 and the complementary clock to the first comparing unit 1111 and the second comparing unit 1121.

Figure 8:
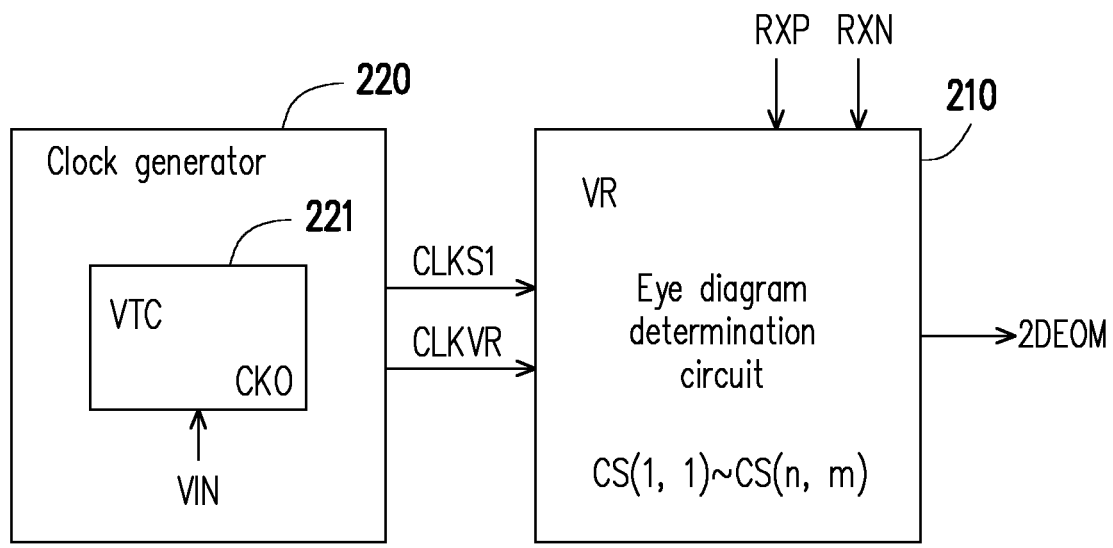
FIG. 8 is a block diagram illustrating an eye diagram observation device according to a second embodiment of the invention.

Referring to FIG. 8, FIG. 8 is a block diagram illustrating an eye diagram observation device according to a second embodiment of the invention. In the present embodiment, an eye diagram observation device 200 includes an eye diagram determination circuit 210 and a clock generator 220. The eye diagram determination circuit 210 receives a reference voltage control clock CLKVR, the first delayed sampling clock CLKS1 and an input signal pair. The input signal pair may be a differential signal pair. The input signal pair includes the first input signal RXP and the second input signal RXN. The eye diagram determination circuit 210 provides a plurality of reference signals VR based on the reference voltage control clock CLKVR and sequentially compares the input signal pair with the reference signals VR based on the first delayed sampling clock CLKS1 to obtain comparison results CS(1, 1) to CS(n, m). The eye diagram determination circuit 210 compares the comparison results CS(1, 1) to CS(n, m), so as to obtain an eye diagram 2DEOM corresponding to the input signal pair.

In the present embodiment, the clock generator 220 is coupled to the eye diagram determination circuit 210. The clock generator 220 generates the reference voltage control clock CLKVR and the first delayed sampling clock CLKS1. The clock generator 220 includes a voltage to time converter (VTC) 221. The VTC 221 generates the delayed clock CKO based on the voltage value of the input voltage VIN. The delay time length of the delayed clock CKO is associated with the voltage value of the input voltage VIN. The clock generator 220 generates the first delayed sampling clock CLKS1 based on the delayed clock CKO.

It is to be mentioned that in the present embodiment, the clock generator 220 provides the delayed clock CKO via the VTC 221. In comparison with the multi-stage ring oscillator, the VTC 221 has less power consumption and a smaller layout area. In this way, the eye diagram observation device 200 with saved power consumption and a reduced layout area may be accomplished.

Figure 9:
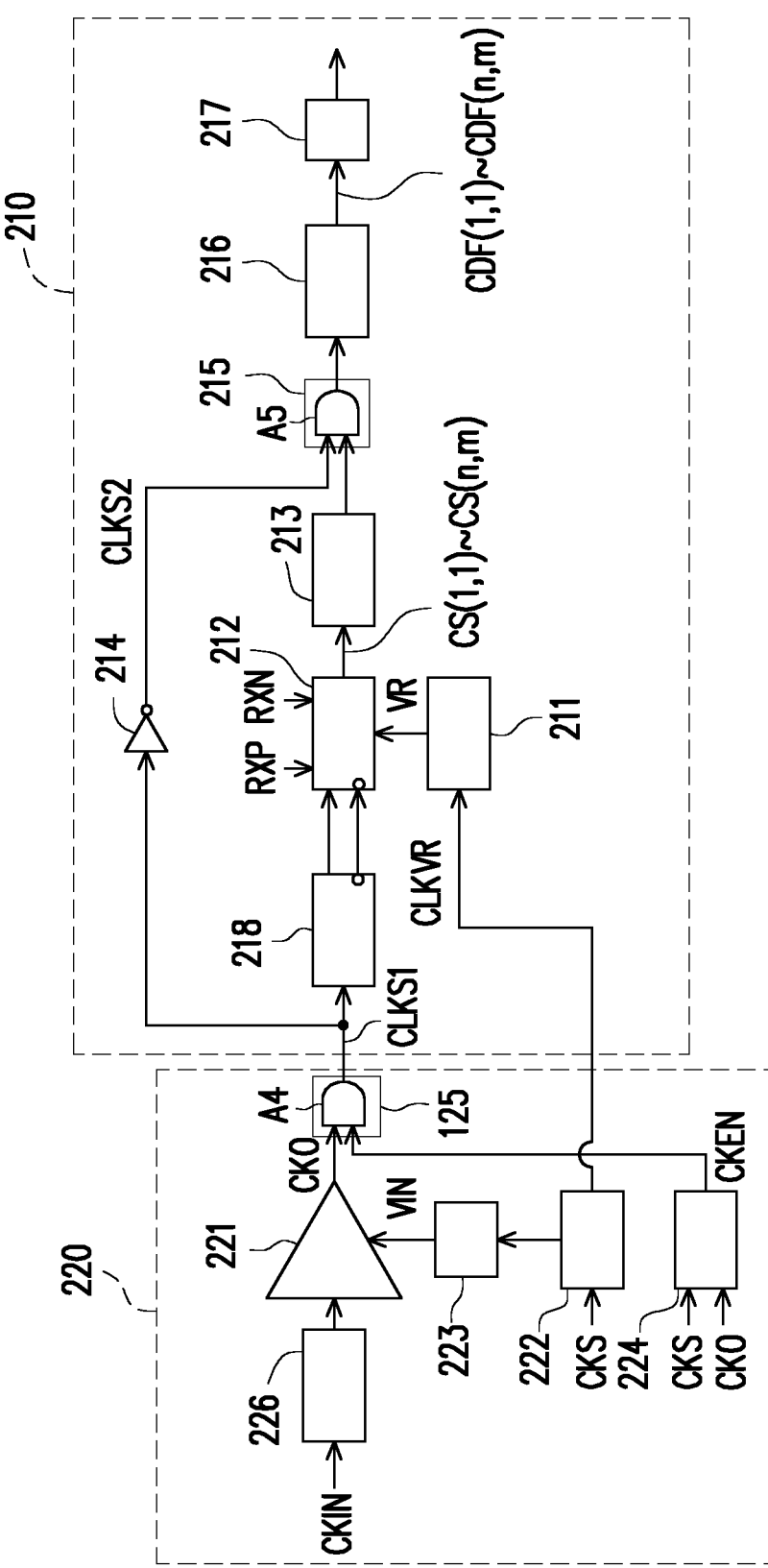
FIG. 9 is a schematic circuit diagram illustrating the eye diagram observation device according to the embodiment depicted in FIG. 8.

Furthermore, referring to FIG. 9, FIG. 9 is a schematic circuit diagram illustrating the eye diagram observation device according to the embodiment depicted in FIG. 8. In the present embodiment, in addition to the VTC 221, the clock generator 220 further includes a clock counter 222 and a format conversion circuit 223. Implementation details related to the collaborative operation among the VTC 221, the clock counter 222 and the format conversion circuit 223 may be sufficiently taught from the first embodiment and thus, will not be repeated. By deducing in the same way, the clock counter 222 may be a 6-bit counter (which is not limited in the invention). Thus, the VTC 221 may delay the delayed clock CKO according to the bits of the clock counter 222 in 64 different manners. Accordingly, the VTC 221 may substitute for the multi-stage ring oscillator.

However, different from the first embodiment, the clock counter 222 may also generates the reference voltage control clock CLKVR with an overflow of the count value. That is to say, once the overflow occurs to the clock counter 222, the count value is reset, and a logical value of the reference voltage control clock CLKVR is transited. For example, the clock counter 222 may be a counter having 6 bits. The frequency of the reference clock CKS is about 1 MHz, and a frequency of the reference clock CLKVR is about 16 kHz.

In the present embodiment, the clock generator 120 includes an enable clock generator 224 and a logical circuit 225 (but the invention is not limited thereto). Implementation details related to the enable clock generator 224 and the logical circuit 225 may be sufficiently taught from the first embodiment and thus, will not be repeated. In this way, the waveforms of the enable clock CKEN and the first delayed sampling clock CLKS1 are as illustrated in FIG. 6.

In the present embodiment, the clock generator 220 further includes an external clock delay circuit 226 (but the invention is not limited thereto). Implementation details related to the external clock delay circuit 226 may be sufficiently taught by the first embodiment and thus, will not be repeated.

In the present embodiment, the eye diagram determination circuit 210 includes a reference signal generation circuit 211 and a comparing unit 212. The reference signal generation circuit 211 is coupled to the clock generator 220. The reference signal generation circuit 211 receives the reference voltage control clock CLKVR provided by the clock generator 220 and generates a plurality of reference signals VR based on the reference voltage control clock CLKVR. The comparing unit 212 is coupled to the clock generator 220 and the reference signal generation circuit 211. The comparing unit 212 receives the input signal pair and the reference signals VR. The comparing unit 212 sequentially compares the input signal pair with the reference signals VR based on the first delayed sampling clock CLKS1 to obtain the comparison results CS(1, 1) to CS(n, m). For example, the comparing unit 212 receives the first input signal RXP, the second input signal RXN and a first reference signal among the reference signal VR based on a first delay associated with the first delayed sampling clock CLKS1. The comparing unit 212 receives the first input signal RXP, the second input signal RXN and a second reference signal among the reference signal VR based on a second delay associated with the first delayed sampling clock CLKS1.

In the present embodiment, the reference signal generation circuit 211 may be an 8-bit reference signal generating circuit (but the invention is not limited in this regard). The reference signal generation circuit 211 may generate the reference signals VR having 256 different voltage values based on the reference voltage control clock CLKVR. For example, the reference signal generation circuit 211 provides the first reference signal among the reference signals VR at a first rising edge of the reference voltage control clock CLKVR and provides the first reference signal to the comparing unit 212. The reference signal generation circuit 211 provides the second reference signal among the reference signals VR at a second rising edge of the reference voltage control clock CLKVR and provides the second reference signal to the comparing unit 212.

In the present embodiment, when the comparing unit 212 receives the first reference signal among the reference signals VR, the comparing unit 212 compares the voltage value of the first input signal RXP, the voltage value of the second input signal RXN and the voltage value of the first reference signal based on the first delay that the first delayed sampling clock CLKS1 goes through to obtain the comparison result CS(1, 1). The comparing unit 212 compares the voltage value of the first input signal RXP, the voltage value of the second input signal RXN and the voltage value of the first reference signal based on the second delay that the first delayed sampling clock CLKS1 goes through to obtain the comparison result CS(1, 2), and the rest may be derived by analog. Thus, when receiving the first reference signal, the comparing unit 212 obtains the comparison results CS(1, 1) to CS(1, m) based on the first delayed sampling clock CLKS1. In the present embodiment, the comparison results CS(1, 1) to CS(1, m) may be results employed to indicate that the voltage value of the first input signal RXP and the voltage value of the second input signal RXN are greater than that of the first reference signal. Taking the comparison result CS(1, 1) as an example, a plurality of determination results corresponding to the comparison result CS(1, 1) may be obtained for the CS(1, 1) based on a plurality of triggers of the first delayed sampling clock CLKS1. Moreover, for example, when the first delayed sampling clock CLKS1 goes through the first delay, if the voltage value of the first input signal RXP is obviously greater than or obviously less than the voltage value of the first reference signal, the comparison result CS(1, 1) includes a plurality of substantially the same determination results. On the other hand, if the voltage value of the first input signal RXP is close to the voltage value of the first reference signal, the comparison result CS(1, 1) includes a plurality of different determination results.

Thereafter, when receiving the second reference signal among the reference signals VR, the comparing unit 212 obtains the comparison results CS(2, 1) to CS(2, m) based on the first delayed sampling clock CLKS1. Thereafter, when the comparing unit 212 receives a third reference signal among the reference signals VR, the comparing unit 212 obtains the comparison results CS(3, 1) to CS(3, m) based on the first delayed sampling clock CLKS1, and the rest may be derived by analog. In this way, the comparing unit 212 may compare the comparison results CS(1, 1) to CS(n, m).

In some embodiments, the reference signals VR may by differential signals, respectively. The comparing unit 212 may compare the voltage level of the first input signal RXP with a voltage value of a first differential signal among the reference signals VR and compare the voltage level of the first input signal RXP with a voltage value of a second differential signal among the reference signals VR, so as to obtain the comparison results CS(1, 1) to CS(n, m). Signal formats of the reference signals VR and the comparison method are not limited in the invention.

In the present embodiment, the eye diagram determination circuit further includes a format conversion circuit 213, an inverter 214, a sampling circuit 215, a counter 216 and a count value output unit 217. The format conversion circuit 213 is coupled to the comparing unit 212. The format conversion circuit 213 respectively converts the comparison results CS(1, 1) to CS(n, m) into a plurality of comparative logical results. The inverter 214 is coupled to the clock generator. The inverter 214 inverts the first delayed sampling clock CLKS1 to generate the second delayed sampling clock CLKS2. The first sampling circuit 215 is coupled to the inverter 214 and the format conversion circuit 213. The sampling circuit 215 samples the comparative logical results based on the second delayed sampling clock CLKS2, so as to provide a plurality of sampling results. The counter 216 is coupled to the sampling circuit 215. The counter 216 counts the sampling results to obtain count values CDF(1, 1) to CDF(n, m) associated with the comparison results. The count value output unit 217 is coupled to the counter 216. The count value output unit 217 receives the count values CDF(1, 1) to CDF(n, m) and outputs the count values CDF(1, 1) to CDF(n, m) in response to the control of the counter 216. In some embodiments, the count value output unit 217 may be implemented by at least one flipflop.

For example, the format conversion circuit 213 provides a comparative logical result corresponding to the comparison result CS(1, 1) according to the comparison result CS(1, 1). The format conversion circuit 213 may convert the comparison result CS(1, 1) in an analog signal format into the a comparative logical result in a digital format. The sampling circuit 215 samples the comparative logical result corresponding to the comparison result CS(1, 1) based on the second delayed sampling clock CLKS2, so as to provide the first sampling result corresponding to the comparison result CS(1, 1). The sampling circuit 215 provides the first sampling result based on the rising edge of the second delayed sampling clock CLKS2. That is to say, the eye diagram determination circuit sequentially obtains the comparison results CS(1, 1) to CS(1, n) based on a plurality of delays that the first delayed sampling clock CLKS1 goes through and sequentially provides the sampling results associated with the comparison results CS(1, 1) to CS(1, n) corresponding to a plurality of falling edges of the first delayed sampling clock CLKS1. The counter 216 counts the sampling results to obtain the count value CDF(1, 1) associated with the comparison result CS(1, 1). The count value output unit 217 receives the count value CDF(1, 1) and outputs the count value CDF(1, 1) in response to the control of the counter 216. For example, the counter 216 may provide a control signal to instruct the count value output unit 217 to output the count value CDF(1, 1). In the present embodiment, a time point at which the control signal occurs may be consist with the falling edge of the enable clock CKEN. Thus, the second count value output unit 217 outputs the count value CDF(1, 1) at the time point of the falling edge of the enable clock CKEN. By deducing in the same way, the eye diagram determination circuit 210 may sequentially count values CDF(1, 2) to CDF(n, m) associated with the comparison results CS(1, 2) to CS(n, m) and sequentially outputs the count values CDF(1, 2) to CDF(n, m).

In the present embodiment, the sampling circuit 215 may at least include an AND logical gate A5. A first input terminal of the AND logical gate A5 is coupled to the format conversion circuit 213. A second input terminal of the AND logical gate A5 is coupled to the output terminal of the inverter 214. An output terminal of the AND logical gate A5 is employed to provide the sampling result corresponding to the comparison result CS(1, 1).

In the present embodiment, the eye diagram observation device 200 may be further employed to store the count values CDF(1, 1) to CDF(n, m) output by the count value output unit 217. The eye diagram observation device 200 may lay out the count values CDF(1, 1) to CDF(n, m). The eye diagram observation device 200 may store the count values CDF(1, 1) to CDF(n, m) with a memory unit. The eye diagram observation device 200 may compare the count values CDF(1, 1) to CDF(n, m), so as to obtain the eye diagram corresponding to the input signal pair.

Figure 10A:
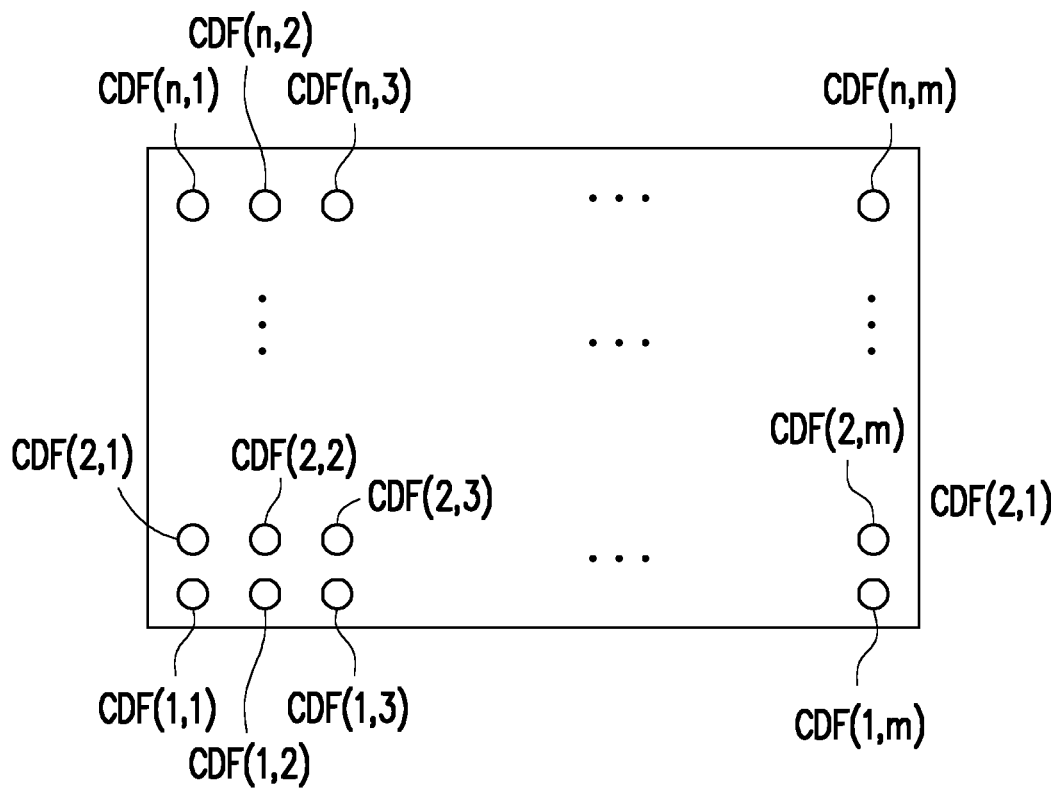
FIG. 10A is a schematic layout diagram illustrating count values according to the second embodiment of the invention.

Furthermore, referring to FIG. 8 and FIG. 10A, FIG. 10A is a schematic layout diagram illustrating count values according to the second embodiment of the invention. The eye diagram observation device 200 may lay out the count values CDF(1, 1) to CDF(n, m). In the present embodiment, the count values CDF(1, 1) to CDF(1, m) may be laid out in the same row, thereby indicating that the count values CDF(1, 1) to CDF(1, m) are generated according to the input signal pair and the first reference signal. The count values CDF(2, 1) to CDF(2, m) may be laid out in the same row, thereby indicating that the count values CDF(2, 1) to CDF(2, m) are generated according to the input signal pair and the second reference signal, and the rest may be derived by analog.

In the present embodiment, the count values CDF(1, 1), CDF(2, 1), . . . and CDF(n, 1) are a laid out in the same column, thereby indicating that the count values CDF(1, 1), CDF(2, 1), . . . and CDF(n, 1) are generated based on the first delay associated with the first delayed sampling clock CLKS1. The count values CDF(1, 2), CDF(2, 2), . . . and CDF(n, 2) are laid out in the same column, thereby indicating that the count values CDF(1, 2), CDF(2, 2), . . . and CDF(n, 2) are generated based on the second delay associated with the first delayed sampling clock CLKS1, and the rest may be derived by analog. The count values CDF(1, 1) to CDF(n, m) may be respectively considered as cumulative distribution functions. Taking the clock counter 222 which is a 6-bit counter and the reference signal generation circuit 211 which is a 8-bit reference signal generation circuit for example, m is 64, and n is 256. That is to say, the layout is an array with 256 rows and 64 columns.

Figure 10B:
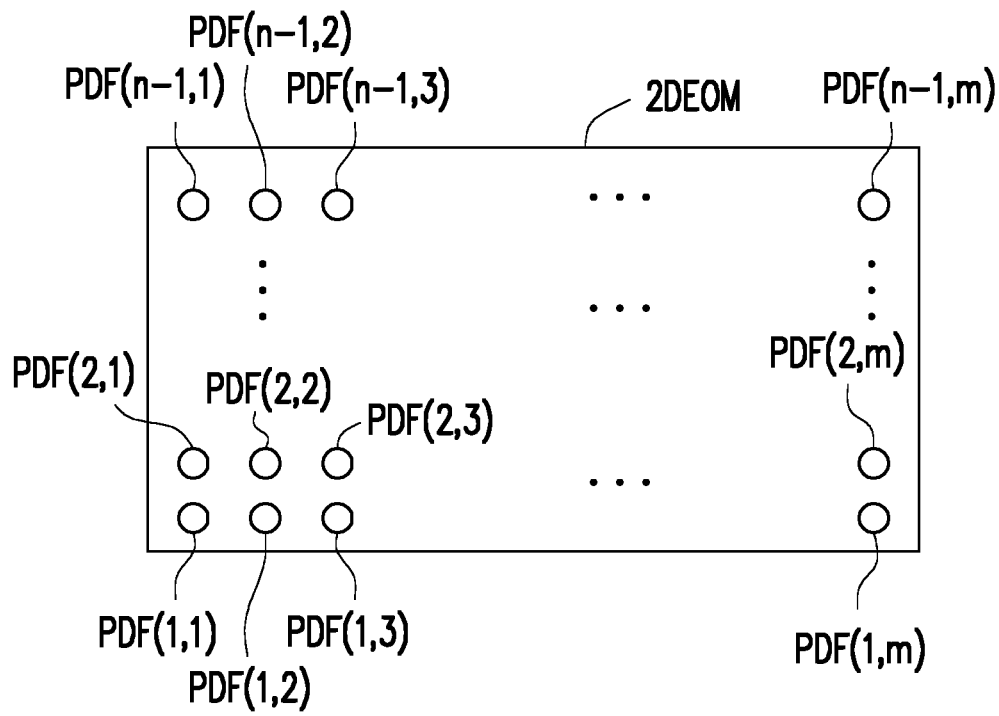
FIG. 10B illustrates an eye diagram according to the second embodiment of the invention.

Referring to FIG. 8, FIG. 10A and FIG. 10B simultaneously, FIG. 10B illustrates an eye diagram according to the second embodiment of the invention. The eye diagram 2DEOM is generated according to the layout of the count values CDF(1, 1) to CDF(n, m) illustrated in FIG. 10A. In the present embodiment, the eye diagram observation device 200 performs a subtraction operation on the count value CDF(1, 1) and the count value CDF(2, 1) to obtain an absolute value of a difference between the count value CDF(1, 1) and the count value CDF(2, 1). The aforementioned absolute value may be considered as a part of information PDF(1, 1). The eye diagram observation device 200 performs a subtraction operation on the count value CDF(1, 2) and the count value CDF(2, 2) to obtain an absolute value of a difference between the count value CDF(1, 2) and the count value CDF(2, 2). The aforementioned absolute value may be considered as a part of the information PDF(1, 2), and the rest may be derived by analog. In this way, the eye diagram observation device 200 provides parts of the information PDF(1, 1) to PDF(n−1, m) according to the count values CDF(1, 1) to CDF(n, m) and generates the eye diagram 2DEOM according to the parts of the information PDF(1, 1) to PDF(n−1, m). The eye diagram 2DEOM of the present embodiment has 255 rows and 64 columns of pixels. The parts of the information PDF(1, 1) to PDF(n−1, m) may be respectively considered as probability density functions. The parts of the information PDF(1, 1) to PDF(n−1, m) have indication results respectively corresponding to the aforementioned absolute values.

Among the parts of the information PDF(1, 1) to PDF(n−1, m), the part of the information with a value which is equal to 0 (or close to 0) represents a very low probability that a part of the waveform of the input signal pair exists on the corresponding pixel. Among the parts of the information PDF(1, 1) to PDF(n−1, m), the greater value the part of the information has, the higher the probability that a part of the waveform of the input signal pair exists on the corresponding pixel is. In this way, the values of the parts of the information PDF(1, 1) to PDF(n−1, m) may indicate the waveform status of the input signal pair. That is to say, the eye diagram observation device 200 may measure the eye diagram of the input signal pair according to the results of the parts of the information PDF(1, 1) to PDF(n−1, m) and determine the status of the input signal pair according to the results of the parts of the information PDF(1, 1) to PDF(n−1, m).

Returning to FIG. 9, in some embodiments, according to a demand of a circuit aspect of the comparing unit 212, the eye diagram determination circuit 210 may further include a clock format conversion circuit 218 (but the invention is not limited in this regard). The clock format conversion circuit 218 generates a complementary clock of the first delayed sampling clock CLKS1 according to the first delayed sampling clock CLKS1 and provides the first delayed sampling clock CLKS1 and the complementary clock to the second comparing unit 212.

Based on the above, the delayed sampling clocks of the eye diagram observation device of the invention is generated by the voltage to time converter. In comparison with the multi-stage ring oscillator, the voltage to time converter has less power consumption and a smaller layout area. As such, the eye diagram observation device with the saved power consumption and reduced layout area can be accomplished.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An eye diagram observation device, for defining an eye diagram corresponding to an input signal pair, comprising:
    an eye diagram determination circuit, configured to receive a first delayed sampling clock and the input signal pair, compare a first input signal and a second input signal of the input signal pair based on the first delayed sampling clock to obtain a plurality of comparison results and compare the comparison results, so as to obtain the eye diagram corresponding to the input signal pair; and
    a clock generator, coupled to the eye diagram determination circuit, comprising:
        a voltage to time converter, configured to generate a delayed clock based on a voltage value of an input voltage, wherein a delay time length of the delayed clock is associated with the voltage value of the input voltage,
        wherein the clock generator generates the first delayed sampling clock based on the delayed clock.

2. The eye diagram observation device according to claim 1, wherein the voltage to time converter comprises:
    an input stage circuit, configured to serve the input voltage as a conversion voltage based on an external clock;
    a capacitor, having a first terminal coupled to the input stage circuit to receive the conversion voltage and a second terminal coupled to a reference low voltage level; and
    an output stage circuit, coupled to the input stage circuit and the first terminal of the capacitor and configured to provide the delayed clock according to a voltage value of the conversion voltage and a voltage value of a predetermined voltage.

3. The eye diagram observation device according to claim 2, wherein the input stage circuit comprises:
    an inverter, having an input terminal employed to receive the external clock;
    a first input stage transistor, having a first terminal employed to receive the input voltage, a second terminal coupled to the first terminal of the capacitor and a control terminal coupled to an output terminal of the inverter;
    a second input stage transistor, having a first terminal coupled to the second terminal of the first input stage transistor and a control terminal coupled to the output terminal of the inverter;
    a third input stage transistor, having a first terminal coupled to a second terminal of the second input stage transistor, a second terminal coupled to the reference low voltage level and a control terminal employed to receive a bias voltage, wherein the third input stage transistor is configured as a current source; and
    a fourth input stage transistor, having a first terminal employed to receive a reference high voltage level, a second terminal coupled to the second terminal of the second input stage transistor and a control terminal employed to receive the external clock.

4. The eye diagram observation device according to claim 2, wherein the output stage circuit comprises:
    a first output stage transistor, having a first terminal employed to receive a reference high voltage and a control terminal employed to receive a bias voltage, wherein the first input stage transistor is configured as a current source;
    a second output stage transistor, having a first terminal coupled to a second terminal of the first output stage transistor and a control terminal coupled to the first terminal of the capacitor;
    a third output stage transistor, having a first terminal coupled to the second terminal of the first output stage transistor and a control terminal employed to receive the predetermined voltage;
    a fourth output stage transistor, having a first terminal coupled to a second terminal of the second output stage transistor, a second terminal coupled to the reference low voltage level and a control terminal employed to receive the external clock;
    an inverter, having an input terminal coupled to the second terminal of the second output stage transistor, and an output terminal of the inverter being employed as an output terminal of the voltage to time converter; and
    a fifth output stage transistor, having a first terminal coupled to a second terminal of the third output stage transistor and a second terminal coupled to the reference low voltage level, wherein the first terminal of the fifth output stage transistor is coupled to the output terminal of the inverter.

5. The eye diagram observation device according to claim 1, wherein the clock generator further comprises:
   a clock counter, configured to receive a reference clock and count the reference clock to obtain a count value; and
   a format conversion circuit, coupled to the clock counter and the voltage to time converter and configured to receive the count value and provide the input voltage according to the count value,
   wherein the voltage value of the input voltage is associated with the count value.

6. The eye diagram observation device according to claim 5, wherein the clock generator further comprises:
   an enable clock generator, configured to generate an enable clock according to the reference clock and the delayed clock; and
   a logical circuit, coupled to the enable clock generator, the voltage to time converter and the eye diagram determination circuit and configured to perform a logical operation on the enable clock and the delayed clock to generate the first delayed sampling clock.

7. The eye diagram observation device according to claim 1, wherein the eye diagram determination circuit comprises:
   a first count value generator, coupled to the clock generator and configured to obtain a plurality of first comparison results among the comparison results based on the first delayed sampling clock when a voltage level of the first input signal is equal to a voltage level of the second input signal and count the number of occurrence times of the first comparison results, so as to generate a plurality of first count values;
   a second count value generator, coupled to the clock generator and configured to obtain a plurality of second comparison results among the comparison results based on the first delayed sampling clock when an absolute value of a difference between a voltage level of the first input signal and a voltage level of the second input signal is equal to a preset value and count the number of occurrence times of the second comparison results, so as to generate a plurality of second count values; and
   a logical circuit, coupled to the first count value generator and the second count value generator and configured to provide eye diagram information according to the first count values and the second count values.

8. The eye diagram observation device according to claim 7, wherein the eye diagram determination circuit comprises:
   an inverter, coupled to the clock generator and configured to invert the first delayed sampling clock to generate a second delayed sampling clock.

9. The eye diagram observation device according to claim 8, wherein the first count value generator comprises:
   a first comparing unit, coupled to the clock generator and configured to receive the first delayed sampling clock, the first input signal and the second input signal and configured to obtain the first comparison results among the comparison results based on the first delayed sampling clock when a voltage level of the first input signal is equal to a voltage level of the second input signal;
   a first format conversion circuit, coupled to the first comparing unit and configured to respectively convert the first comparison results into a plurality of first comparative logical results;
   a first sampling circuit, coupled to the inverter and the first format conversion circuit and configured to sample the first comparative logical results based on the second delayed sampling clock, so as to provide a plurality of first sampling results corresponding to the first comparison results; and
   s first counter, coupled to the first sampling circuit and configured to count the first sampling results to obtain the first count values associated with the first comparison results; and
   a first count value output unit, coupled to the first counter and configured to receive the first count values and output the first count values in response to the control of the first counter.

10. The eye diagram observation device according to claim 8, wherein the second count value generator comprises:
    a second comparing unit, coupled to the clock generator and configured to receive the first delayed sampling clock, the first input signal and the second input signal and obtain the second comparison results among the comparison results based on the first delayed sampling clock when the absolute value of the difference between the voltage level of the first input signal and the voltage level of the second input signal is equal to the preset value;
    a second format conversion circuit, coupled to the second comparing unit and configured to respectively convert the second comparison results into a plurality of second comparative logical results;
    a second sampling circuit, coupled to the inverter and the second format conversion circuit and configured to sample the second comparative logical results based on the second delayed sampling clock, so as to provide a plurality of second sampling results corresponding to the second comparison results;
    a second counter, coupled to the second sampling circuit and configured to count the second sampling results to obtain the second count values associated with the second comparison results; and
    a second count value output unit, coupled to the second counter and configured to receive the second count values and output the second count values in response to the control of the second counter.

11. An eye diagram observation device, for defining an eye diagram corresponding to an input signal pair, comprising:
    an eye diagram determination circuit, configured to receive a reference voltage control clock, a first delayed sampling clock and the input signal pair, provide a plurality of reference signals based on the reference voltage control clock, sequentially compare the input signal pair with the reference signals based on the first delayed sampling clock to obtain a plurality of comparison results and compare the comparison results, so as to obtain the eye diagram corresponding to the input signal pair; and
    a clock generator, coupled to the eye diagram determination circuit and configured to generate the reference voltage control clock and the first delayed sampling clock based on the delayed clock, wherein the clock generator comprises:
    a voltage to time converter, configured to generate a delayed clock based on a voltage value of an input voltage, wherein a delay time length of the delayed clock is associated with the voltage value of the input voltage,
    wherein the clock generator generates the first delayed sampling clock according to the delayed clock.

12. The eye diagram observation device according to claim 11, wherein the voltage to time converter comprises:
an input stage circuit, configured to serve the input voltage as a conversion voltage based on an external clock;
a capacitor, having a first terminal coupled to the input stage circuit to receive the conversion voltage and a second terminal coupled to a reference low voltage level; and
an output stage circuit, coupled to the input stage circuit and the first terminal of the capacitor and configured to provide the delayed clock according to a voltage value of the conversion voltage and a voltage value of a predetermined voltage.

13. The eye diagram observation device according to claim 12, wherein the input stage circuit comprises:
an inverter, having an input terminal employed to receive the external clock;
a first input stage transistor, having a first terminal employed to receive the input voltage, a second terminal coupled to the first terminal of the capacitor and a control terminal coupled to an output terminal of the inverter;
a second input stage transistor, having a first terminal coupled to the second terminal of the first input stage transistor and a control terminal coupled to the output terminal of the inverter;
a third input stage transistor, having a first terminal coupled to a second terminal of the second input stage transistor, a second terminal coupled to the reference low voltage level and a control terminal employed to receive a bias voltage, wherein the third input stage transistor is configured as a current source;
a fourth input stage transistor, having a first terminal employed to receive a reference high voltage level, a second terminal coupled to the second terminal of the second input stage transistor and a control terminal employed to receive the external clock.

14. The eye diagram observation device according to claim 12, wherein the output stage circuit comprises:
a first output stage transistor, having a first terminal employed to receive a reference high voltage and a control terminal employed to receive a bias voltage, wherein the first input stage transistor is configured as a current source;
a second output stage transistor, having a first terminal coupled to a second terminal of the first output stage transistor and a control terminal coupled to the first terminal of the capacitor;
a third output stage transistor, having a first terminal coupled to the second terminal of the first output stage transistor and a control terminal employed to receive the predetermined voltage;
a fourth output stage transistor, having a first terminal coupled to a second terminal of the second output stage transistor, a second terminal coupled to the reference low voltage level and a control terminal employed to receive the external clock;
an inverter, having an input terminal coupled to the second terminal of the second output stage transistor, and an output terminal of the inverter being employed as an output terminal of the voltage to time converter; and
a fifth output stage transistor, having a first terminal coupled to a second terminal of the third output stage transistor and a second terminal coupled to the reference low voltage level, wherein the first terminal of the fifth output stage transistor is coupled to the output terminal of the inverter.

15. The eye diagram observation device according to claim 11, wherein the clock generator further comprises:
a clock counter, configured to receive a reference clock and count the reference clock to obtain a count value; and
a format conversion circuit, coupled to the clock counter and the voltage to time converter and configured to receive the count value and provide the input voltage according to the count value,
wherein the voltage value of the input voltage is associated with the count value.

16. The eye diagram observation device according to claim 15, wherein the clock counter generates the reference voltage control clock with an overflow of the count value.

17. The eye diagram observation device according to claim 15, wherein the clock generator further comprises:
an enable clock generator, configured to generate an enable clock according to the reference clock and the delayed clock; and
a logical circuit, coupled to the enable clock generator, the voltage to time converter and the eye diagram determination circuit and configured to perform a logical operation on the enable clock and the delayed clock to generate the first delayed sampling clock.

18. The eye diagram observation device according to claim 11, wherein the eye diagram determination circuit comprises:
a reference signal generation circuit, coupled to the clock generator and configured to receive the reference voltage control clock and generate the reference signals based on the reference voltage control clock; and
a comparing unit, coupled to the clock generator and the reference signal generation circuit and configured to receive the input signal pair and the reference signals and sequentially compare the input signal pair with the reference signals based on the first delayed sampling clock to obtain the comparison results.

19. The eye diagram observation device according to claim 18, wherein the eye diagram determination circuit comprises:
a format conversion circuit, coupled to the comparing unit and configured to respectively convert the comparison results into a plurality of comparative logical results;
an inverter, coupled to the clock generator and configured to invert the first delayed sampling clock to generate a second delayed sampling clock;
a sampling circuit, coupled to the inverter and the format conversion circuit and configured to sample the comparative logical results based on the second delayed sampling clock, so as to provide a plurality of sampling results;
a counter, coupled to the sampling circuit and configured to count the sampling results to obtain a plurality of count values associated with the comparison results; and
a count value output unit, coupled to the counter and configured to receive the count values and output the count values in response to the control of the second counter.

20. The eye diagram observation device according to claim 19, wherein the eye diagram determination circuit stores a plurality of count values associated with the comparison results output by the count value output unit and compares the count values, so as to obtain the eye diagram corresponding to the input signal pair.

\* \* \* \* \*